(12) United States Patent
Mieno

(10) Patent No.: US 8,420,511 B2
(45) Date of Patent: Apr. 16, 2013

(54) TRANSISTOR AND METHOD FOR FORMING THE SAME

(75) Inventor: Fumitake Mieno, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 73 days.

(21) Appl. No.: 13/196,671

(22) Filed: Aug. 2, 2011

(65) Prior Publication Data

US 2012/0168860 A1 Jul. 5, 2012

(30) Foreign Application Priority Data

Dec. 29, 2010 (CN) .......................... 2010 1 0612652

(51) Int. Cl.
*H01L 21/8238* (2006.01)
*H01L 21/322* (2006.01)
*H01L 29/78* (2006.01)

(52) U.S. Cl.
USPC ............................ 438/473; 438/199; 257/333

(58) Field of Classification Search .................. None
See application file for complete search history.

(56) References Cited

U.S. PATENT DOCUMENTS 7,615,430 B2 * 11/2009 Pawlak .......................... 438/199
2010/0203708 A1 * 8/2010 Fogel et al. .................... 438/473

FOREIGN PATENT DOCUMENTS

CN 101393894 A 3/2009

* cited by examiner

*Primary Examiner* — Fernando L Toledo
*Assistant Examiner* — Valerie N Newton
(74) *Attorney, Agent, or Firm* — Anova Law Group, PLLC

(57) ABSTRACT

The invention provides a method for forming a transistor, which includes: providing a substrate, a semiconductor layer being formed on the substrate; forming a dummy gate structure on the semiconductor layer; forming a source region and a drain region in the substrate and the semiconductor layer and at opposite sides of the dummy gate structure; forming an interlayer dielectric layer on the semiconductor layer; removing the dummy gate structure for forming an opening in the interlayer dielectric layer; non-crystallizing the semiconductor layer exposed in the opening for forming a channel layer; annealing the channel layer so that the channel layer and the substrate have same crystal orientation; and forming a metal gate structure in the opening, the metal gate being formed on the channel layer. Saturation current of the transistor is raised, and the performance of a semiconductor device is promoted.

20 Claims, 6 Drawing Sheets

TRANSISTOR AND METHOD FOR FORMING THE SAME

CROSS REFERENCE TO RELATED APPLICATIONS

The present application claims the priority of Chinese Patent Application No. 201010612652.2, entitled "TRANSISTOR AND METHOD FOR FORMING THE SAME", and filed Dec. 29, 2010, the entire disclosure of which is incorporated herein by reference.

BACKGROUND OF THE INVENTION

1. Field of the Invention

The present invention relates to the field of semiconductor manufacture, and particularly to a transistor and a method for forming the same.

2. Description of Prior Art

Stress Memorization Technique (SMT) and Stress-contact etch stop layer (CESL) are two solutions to promote transistor carrier mobility currently. By virtue of the two solutions, stable stress is formed in a trench of a transistor for promoting carrier mobility in the trench. The stress is parallel to length of the trench, and may be tensile stress or compressive stress. In general, the tensile stress may loosen the atomic arrangement in the trench for promoting mobility of electrons, and is adapted for NMOS transistor. The compressive stress may tighten the atomic arrangement in the trench for promoting mobility of holes, and is adapted for PMOS transistor.

FIGS. 1-3 exemplarily show a conventional method for forming a transistor.

As shown in FIG. 1, a semiconductor substrate 10 is provided. An NMOS transistor and a PMOS transistor are formed in the substrate 10. Isolations 11 are defined between the NMOS transistor and the PMOS transistor. The NMOS transistor includes P well (not shown), an NMOS transistor gate 13, and NMOS transistor source/drain regions 12 in the P well and at opposite sides of the NMOS transistor gate 13. The PMOS transistor includes N well (not shown), a PMOS transistor gate 15, and PMOS transistor source/drain regions 14 in the N well and at opposite sides of the PMOS transistor gate 15.

As shown in FIG. 2, a stress layer 16 is formed on the NMOS transistor and the PMOS transistor for covering the NMOS transistor source/drain regions 12, the NMOS transistor gate 13, the PMOS transistor source/drain regions 14, the PMOS transistor gate 15, and the substrate 10. The stress layer 16 has material of silicon nitride, and has tensile stress or compressive stress.

As shown in FIG. 3, the stress layer 16 on the PMOS transistor source/drain regions 14 and the PMOS transistor gate 15 is removed, while the stress layer 16 on the NMOS transistor source/drain regions 12 and the NMOS transistor gate 13 is remained. The stress layer 16 on the NMOS transistor source/drain regions 12 and the NMOS transistor gate 13 is annealed for providing tensile stress for the NMOS transistor. Thus carrier (electrons) mobility in the NMOS transistor trench may be promoted. After annealing, the stress layer 16 on the NMOS transistor source/drain regions 12 and the NMOS transistor gate 13 is removed by etching.

By the conventional method for forming a transistor, saturation current of the transistor is too low. It is desired to address this issue.

SUMMARY OF THE INVENTION

Embodiments of the present invention provide a method for forming a transistor, which raises saturation current of the transistor, thereby promoting device performance.

In an embodiment, a method for forming a transistor includes:

providing a substrate, a semiconductor layer being formed on the substrate, the semiconductor layer and the substrate having different crystal orientation;

forming a dummy gate structure on the semiconductor layer;

forming a source region and a drain region in the substrate and the semiconductor layer and at opposite sides of the dummy gate structure;

forming an interlayer dielectric layer on the semiconductor layer, the interlayer dielectric layer being substantially flush with the dummy gate structure;

removing the dummy gate structure for forming an opening in the interlayer dielectric layer, the semiconductor layer being exposed in the opening;

non-crystallizing the semiconductor layer exposed in the opening for forming a channel layer;

annealing the channel layer so that the channel layer and the substrate have same crystal orientation; and forming a metal gate structure in the opening, the metal gate being formed on the channel layer.

Optionally, the transistor is an NMOS transistor, the substrate having crystal orientation (100), and the semiconductor layer having crystal orientation (110).

Optionally, the transistor is a PMOS transistor, the substrate having crystal orientation (110), and the semiconductor layer having crystal orientation (100).

Optionally, the non-crystallization is performed by ions implant, and the doped ions of ions implant include silicon ions, germanium ions or carbon ions.

Optionally, the silicon ions of ions implant have energy ranged of 2 to 30 KeV, a tilted angle of 0 to 15 degree, and dose of 9E14 to 3E15 $cm^{-2}$, the germanium ions of ions implant have energy ranged of 5 to 40 KeV, a tilted angle of 0 to 20 degree, and dose of 1E15 to 4E15 $cm^{-2}$, and the carbon ions of ions implant have energy ranged of 1 to 10 KeV, a tilted angle of 0 to 15 degree, and dose of 1E12 to 5E12 $cm^{-2}$. the silicon ions of ions implant have energy ranged of 2 to 30 KeV, a tilted angle of 0 to 15 degree, and dose of 9E14 to 3E15 $cm^{-2}$, the germanium ions of ions implant have energy ranged of 5 to 40 KeV, a tilted angle of 0 to 20 degree, and dose of 1E15 to 4E15 $cm^{-2}$, and the carbon ions of ions implant have energy ranged of 1 to 10 KeV, a tilted angle of 0 to 15 degree, and dose of 1E12 to 5E12 $cm^{-2}$.

Optionally, annealing temperature is ranged from 550 to 750 degree Celsius, and wherein gases for annealing are inertial gas, nitrogen gas, or combination of inert gas and nitrogen gas.

Optionally, the method further includes lightly doped ions implant for forming lightly doped regions in the substrate and the semiconductor layer, and at opposite sides of the dummy gate structure or the metal gate structure.

Optionally, a tilted angle of lightly doped ions implant is ranged from 15 to 40 degrees.

Optionally, forming a metal gate structure on the semiconductor layer includes: forming a high K dielectric layer on a bottom and sidewalls of the opening, and forming a metal gate on the high K dielectric layer, the metal gate and the high K dielectric layer constituting a metal gate structure.

Optionally, the high K dielectric layer has material selected from at least one of hafnium oxide, silicon hafnium oxide, lanthanum oxide, zirconium oxide, silicon zirconium oxide, titanium oxide, tantalum oxide, titanium strontium barium oxide, titanium barium oxide, aluminium oxide and any combination thereof.

Optionally, metal gate spacers are formed on sidewalls of the opening, locations of the metal gate spacers corresponding to locations of the source region and the drain region.

Optionally, the metal gate spacers have material selected from at least one of silicon oxide, silicon nitride, silicon carbon, silicon oxide nitride, and any combination thereof, and wherein the metal gate spacers have thickness of no more than 20 nm.

In another embodiment, a transistor includes:
a substrate, a semiconductor layer being formed on the substrate, the semiconductor layer and the substrate having different crystal orientation;
an interlayer dielectric layer formed on the semiconductor layer;
an opening defined in the interlayer dielectric layer, the semiconductor layer being exposed at a bottom of the opening;
a metal gate structure formed in the opening, and including a high K dielectric layer and a metal gate, the high K dielectric layer being formed on a bottom and sidewalls of the opening;
a source region formed in the semiconductor layer and the substrate;
a drain region formed in the semiconductor layer and the substrate, the source region and the drain region being respectively at opposite sides of the metal gate structure; and
a channel layer located in the semiconductor layer between the source region and the drain region, the channel layer being substantially flush with the semiconductor layer, crystal orientation of the channel layer being same as crystal orientation of the substrate, a location of the channel layer corresponding to a location of the opening.

Compared with the prior art, the technical solutions provided by the invention have the advantages below.

According to an embodiment of the invention, a semiconductor layer is formed on a substrate, and has the crystal orientation different from that of the substrate. A dummy gate is formed on the semiconductor layer. A source region and a drain region are formed in the substrate and the semiconductor layer, and are respectively located on opposite sides of the dummy gate. Then the dummy gate is removed for forming an opening. The semiconductor layer is exposed in a bottom of the opening. The exposed semiconductor layer is non-crystallized and annealed for forming a channel layer. The channel layer acts as a channel region between the source region and the drain region. The semiconductor layer and the substrate have different crystal orientation. Stress is produced between the substrate and the semiconductor layer, whereby carrier mobility, and thus saturation current of the transistor, is raised. The performance of a semiconductor device can be promoted. The crystal orientation of the channel layer is the same as the crystal orientation of the substrate. Therefore, carrier mobility of the channel region of the transistor will not descend.

Metal gate spacers are formed on sidewalls of the opening. The metal gate spacers replace the dummy gate spacers, and have locations corresponding to locations of the source region and the drain region. Therefore, the metal gate structure may be protected, and short trench effect may be prevented. Drain current arising from decreased distance between the source region and the drain region may be reduced.

The metal gate spacers have thickness of no more than 20 nm for preventing from excessively large area of the metal gate spacers which may result in excessively large area of the transistor.

DETAILED DESCRIPTION OF THE EMBODIMENTS

A transistor fabricated by a conventional method has too low saturation current, which may impact device performance. It is found after detailed analysis and research that too low carrier mobility may result in too low saturation current. When the critical dimension of the transistor minishes, for example to 45 nm or so, a thickness of a gate dielectric layer thereof decreases, and a distance between a source region and a drain region is shortened, resulting in serious current leakage of the transistor.

Figure 1:
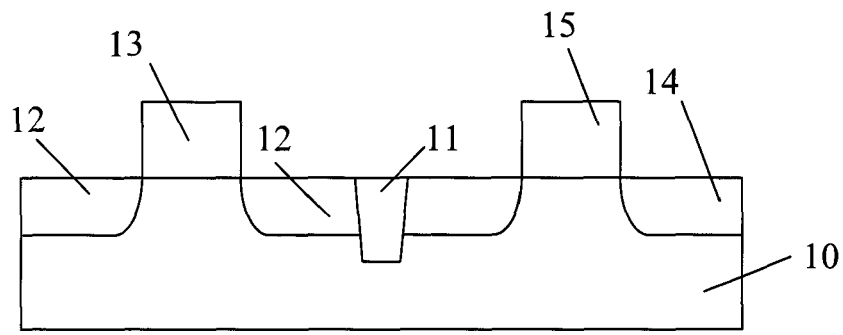
FIGS. 1-3 are cross-sectional views of intermediate structures of a transistor, illustrating a conventional method for forming the transistor.
Figure 2:
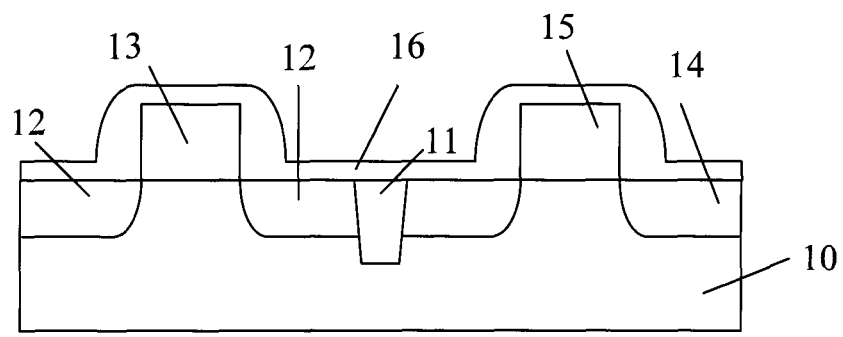
Figure 3:
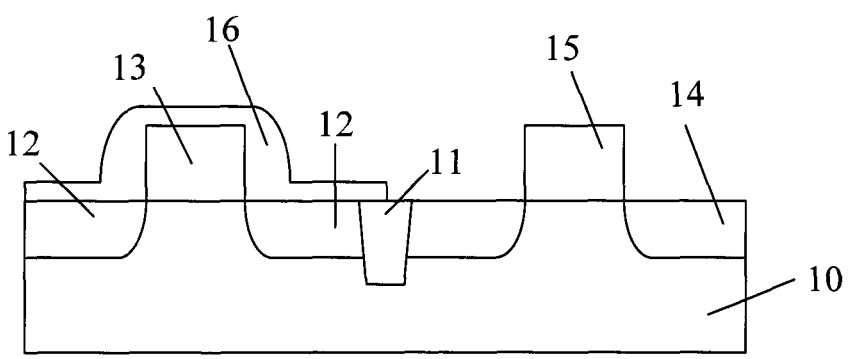
Figure 4:
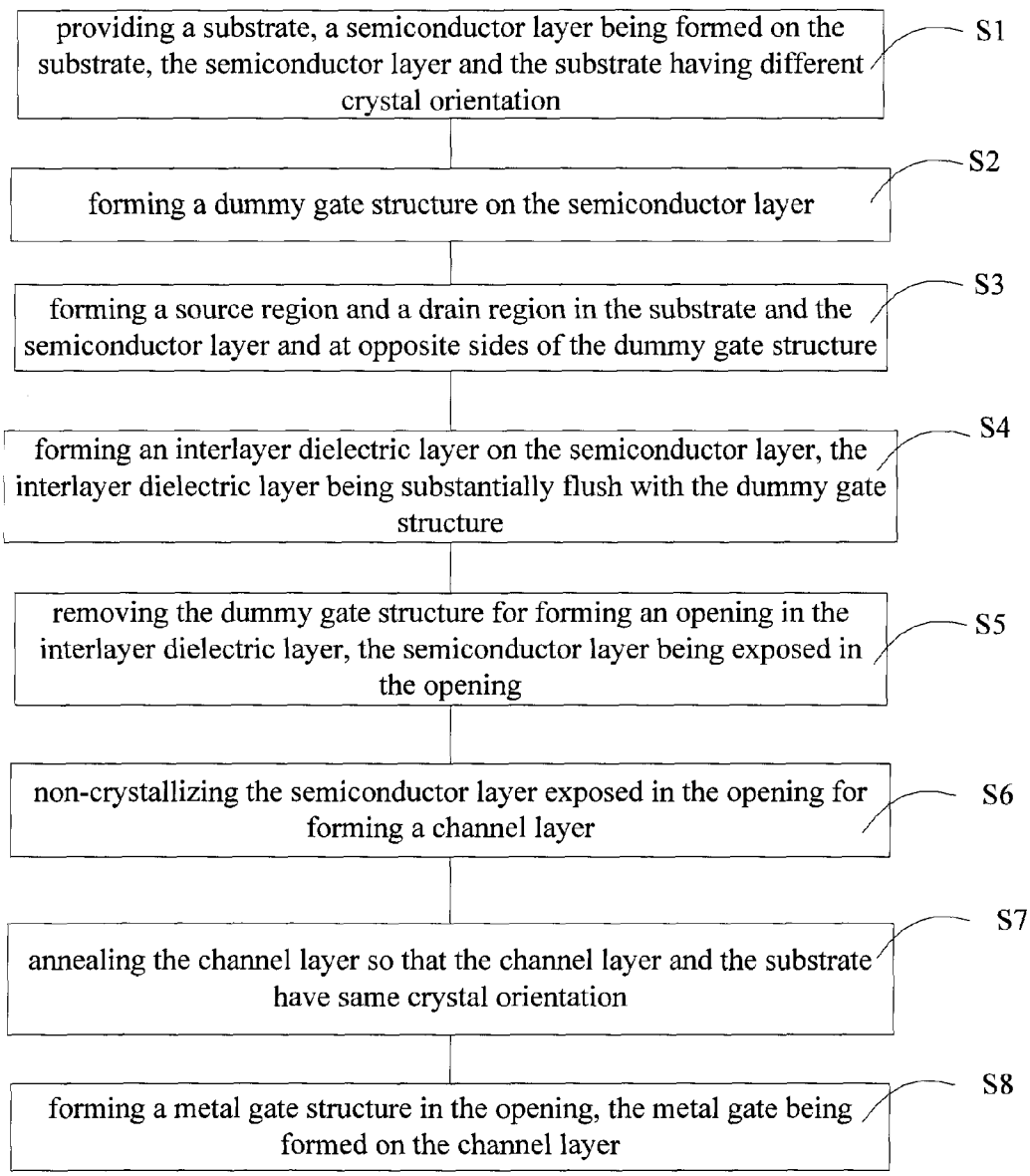
FIG. 4 is a flow chart of the method for forming a transistor according to an embodiment of the present invention.

After creative labor, a method for forming a transistor is proposed. As shown in FIG. 4, the method includes:

S1: providing a substrate, a semiconductor layer being formed on the substrate, the semiconductor layer and the substrate having different crystal orientation;

S2: forming a dummy gate structure on the semiconductor layer;

S3: forming a source region and a drain region in the substrate and the semiconductor layer and at opposite sides of the dummy gate structure;

S4: forming an interlayer dielectric layer on the semiconductor layer, the interlayer dielectric layer being substantially flush with the dummy gate structure;

S5: removing the dummy gate structure for forming an opening in the interlayer dielectric layer, the semiconductor layer being exposed at a bottom of the opening;

S6: non-crystallizing the semiconductor layer in the opening for forming a channel layer;

S7: annealing the channel layer so that the channel layer and the substrate have same crystal orientation;

S8: forming a metal gate structure in the opening, the metal gate structure being formed on the channel layer.

In order to clarify the objects, characteristics and advantages of the invention, embodiments of the invention will be interpreted in detail in combination with accompanied drawings. More examples are provided hereinafter to describe the invention. However, it shall be appreciated by those skilled in the art that alternative ways may be made without deviation from the scope of the invention. Therefore the invention is not limited within the embodiments described here.

FIGS. 5-10 illustrate a method for forming a transistor according to an embodiment of the present invention.

Figure 5:
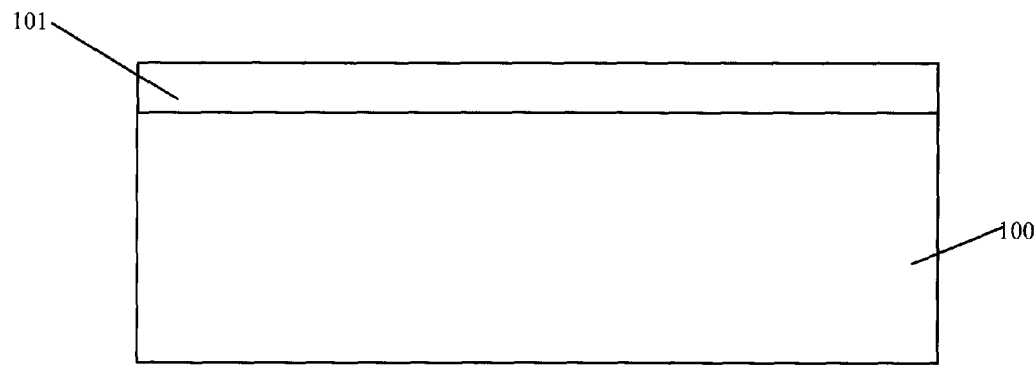
FIGS. 5-10 are cross-sectional view of intermediate structures of a transistor, illustrating a method for forming a transistor according to an embodiment of the present invention.

Referring to FIG. 5, a substrate 100 is provided. A semiconductor layer 101 is formed on the substrate 100. The semiconductor layer 101 and the substrate 100 have different crystal orientation. As a result, stress is produced between the semiconductor layer 101 and the substrate 100. The type of the stress may vary depending on the crystal orientation of the semiconductor layer 101 and the substrate 100.

In one embodiment, the transistor is an NMOS transistor. The substrate 100 has crystal orientation (100), and the semiconductor layer 101 has crystal orientation (110). Tensile stress is produced between the substrate 100 and the semiconductor layer 101, and thus raises mobility of electrons, benefiting saturation current of the NMOS transistor. Alternatively, the transistor is a PMOS transistor. The substrate 100 has crystal orientation (110), and the semiconductor layer 101 has crystal orientation (100). Compressive stress is produced between the substrate 100 and the semiconductor layer 101, and thus raises mobility of holes, thereby promoting saturation current of PMOS transistor.

The semiconductor layer 101 needs a certain thickness, for example 3 nm, for providing sufficient stress. However, the thickness of the semiconductor layer 101 may not be too large for avoiding that the transistor does not meet requirements of the transistor. The semiconductor layer 101 has thickness in a range of less than 32 nm. Therefore, sufficient stress is produced for effectively raising mobility of carriers without impacting on performance of the transistor.

Figure 6:
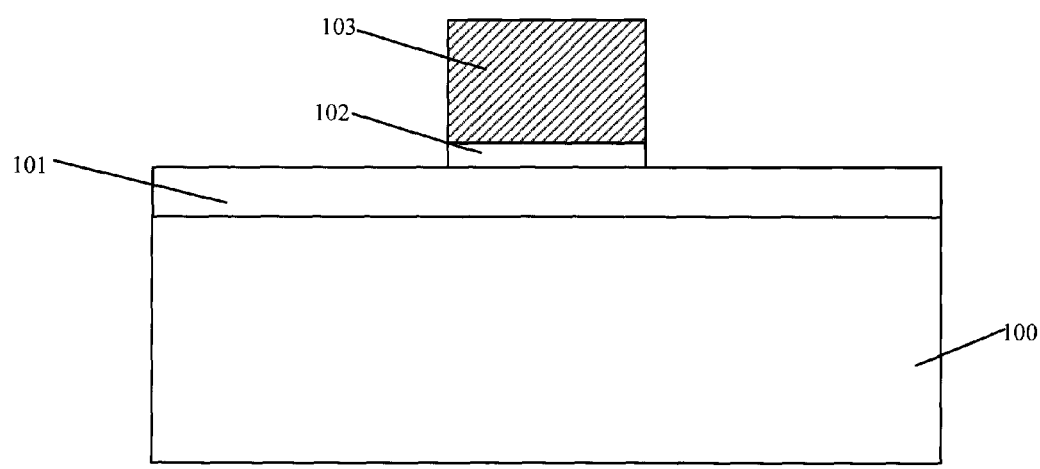

Referring to FIG. 6, a gate dielectric layer 102 is formed on the semiconductor layer 101, and a dummy gate 103 is formed on the gate dielectric layer 102. The dummy gate 103 and the gate dielectric layer 102 constitute a dummy gate structure.

In one embodiment, the gate dielectric layer 102 has electrical isolation material, for example silicon oxide or silicon nitride oxide. The gate dielectric layer 102 has a thickness ranged from 3 to 80 Angstroms. The gate dielectric layer 102 is formed by oxidation process.

The dummy gate 103 has material of polysilicon, and is formed by chemical vapor deposition process. The chemical vapor deposition process is well known in the art.

Figure 7:
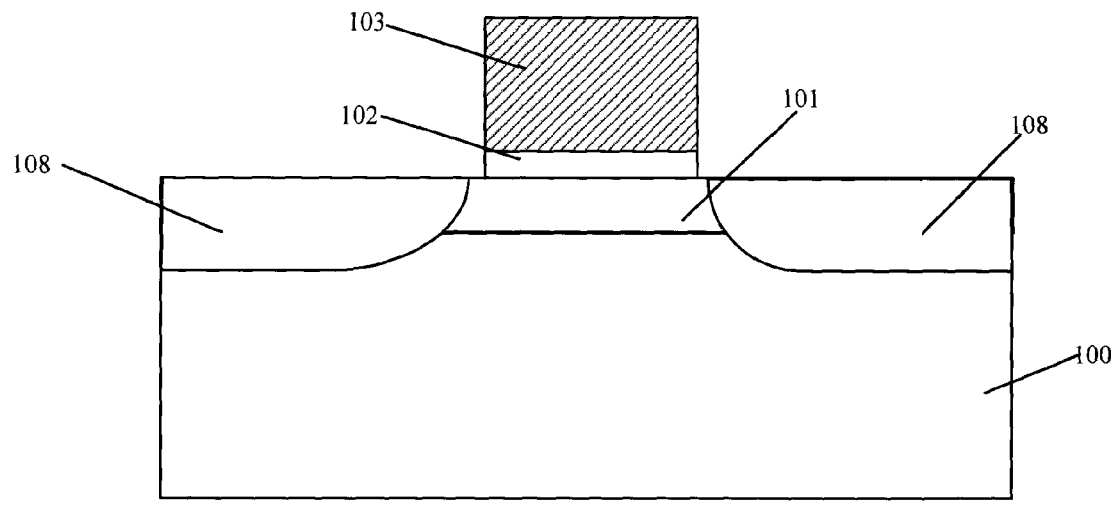

Referring to FIG. 7, lightly doped regions 108 are formed by lightly doped ions implant, and are formed in the substrate 100 and the semiconductor layer 101 and at opposite sides of the dummy gate 103 and the gate dielectric layer 102.

In one embodiment, the lightly doped ions implant has a tilted angle ranged from 14 to 40 degree. The types of doped ions may be chosen according to types of the transistor.

Figure 8:
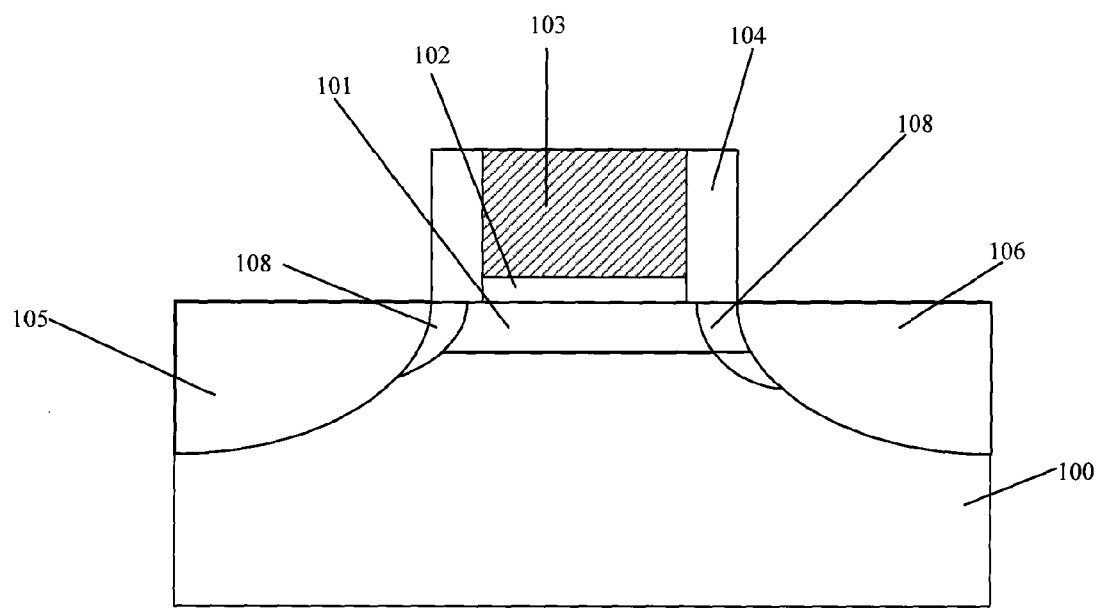

Referring to FIG. 8, dummy gate spacers 104 are formed on the semiconductor layer 101 and at opposite sides of the dummy gate 103 and the gate dielectric layer 102. The dummy gate spacers 104 are formed of a single layer of silicon oxide or silicon nitride. Alternatively, the dummy gate spacers 104 are formed of multi layers, for example ONO structure including silicon oxide layer—silicon nitride layer—silicon oxide layer. The dummy gate spacers 104 may formed by a prior art method.

In one embodiment, the dummy gate spacers 104 may act as a mask in source/drain ions implant for forming source/drain regions in subsequent steps. The dummy gate spacers 104 have locations according to locations of source region and drain region. The thickness of the dummy gate spacers 104 is not too large. Otherwise, a distance between the source region and the drain region may be too large, and hence the transistor has too large area. The dummy gate spacers 104 will be removed to form metal gate spacers in subsequent steps. The metal gate spacers may have thickness of no more than 20 nm. In one embodiment, the dummy gate spacers 104 have thickness identical to thickness of metal gate spacers, and hence may have thickness of no more than 20 nm.

Referring to FIG. 8, taking the dummy gate spacers 104 as a mask, source/drain ions implant are performed in the substrate 100 and the semiconductor layer 101 for forming a source region 105 and a drain region 106. The source region 105 and the drain region 106 are respectively formed at opposite sides of the dummy gate 103 and the gate dielectric layer 102. The source region 105 and the drain region 106 may have locations varying according to locations of the dummy gate spacers 104. The source/drain ions implant is well known in the art.

Figure 9:
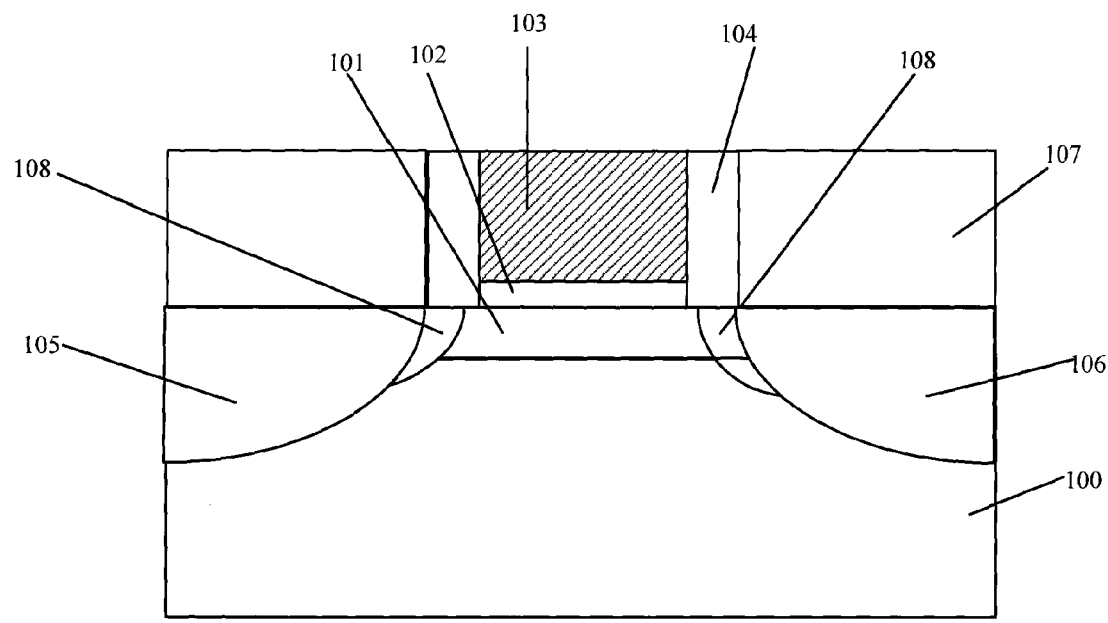

Referring to FIG. 9, an interlayer dielectric layer 107 is formed on the semiconductor layer 101 and is substantially flush with the dummy gate 103 and the dummy gate spacers 104. The interlayer dielectric layer 107 covers the source region 105, the drain region 106 and the lightly doped regions 108.

The interlayer dielectric layer 107 has electrical isolation material, for example, silicon oxide, silicon nitride, silicon carbon or silicon oxide nitride. The interlayer dielectric layer 107 may be formed by chemical vapor deposition process.

Figure 10:
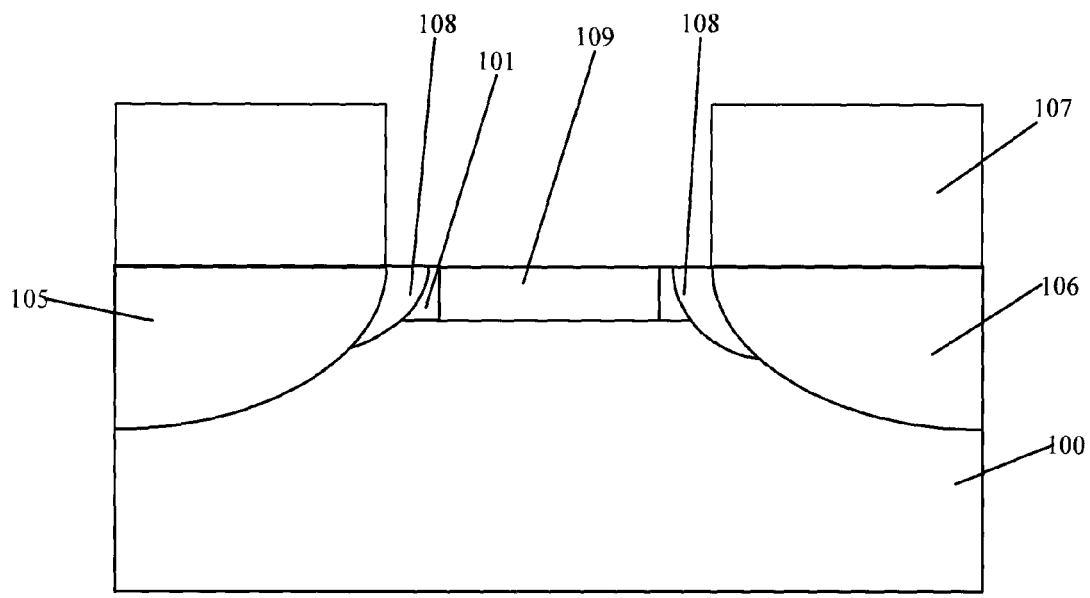

Referring to FIGS. 9 and 10, the dummy gate 103 and the gate dielectric layer 102 are removed by etching. An opening (not labeled) is defined in the interlayer dielectric layer 107. The semiconductor layer 101 is exposed in a bottom of the opening and between the lightly doped regions 108.

The dummy gate spacers 104 have risk of undue etching, which may result in current leakage of the metal gate structure in subsequent steps. In one embodiment, the dummy gate spacers 104 are removed and the lightly doped regions 108 are exposed.

In one embodiment, the semiconductor layer 101 between the lightly doped regions 108 is non-crystallized for forming a channel layer 109 between the lightly doped regions 108. The channel layer 109 works as a channel region of a transistor.

The non-crystallization is formed by ions implant. The doped ions of ions implant include silicon ions, germanium ions or carbon ions. The silicon ions of ions implant have energy ranged of 2 to 30 KeV, a tilted angle of 0 to 15 degree, and dose of 9E14 to 3E15 $cm^{-2}$. The germanium ions of ions implant have energy ranged of 5 to 40 KeV, a tilted angle of 0 to 20 degree, and dose of 1E15 to 4E15 $cm^{-2}$. The carbon ions of ions implant have energy ranged of 1 to 10 KeV, a tilted angle of 0 to 15 degree, and dose of 1E12 to 5E12 $cm^{-2}$.

After non-crystallization process, the channel layer 109 has irregular crystal orientation. In a subsequent step, the channel layer 109 may be adjusted by annealing to achieve the same crystal orientation as that of the substrate 100.

In one embodiment, the channel layer 109 is annealed to rearrange crystal orientation to correspond to crystal orientation of the substrate 100. Parameters of annealing may be chosen so that crystal orientation of the channel layer 109 is the same as crystal orientation of the substrate 100. Annealing temperature is ranged of 550 to 850 degree Celsius. Gases for annealing may be inert gas, nitrogen gas, or combination of inert gas and nitrogen gas. The inert gas may include at least one of Argon, Helium, Xenon and any combination thereof.

After annealing process, the channel layer 109 has the same crystal orientation as that of the substrate 100. In this way, carrier mobility will not be impacted by different crystal orientation between the channel layer 109 and the substrate 100.

Figure 11:
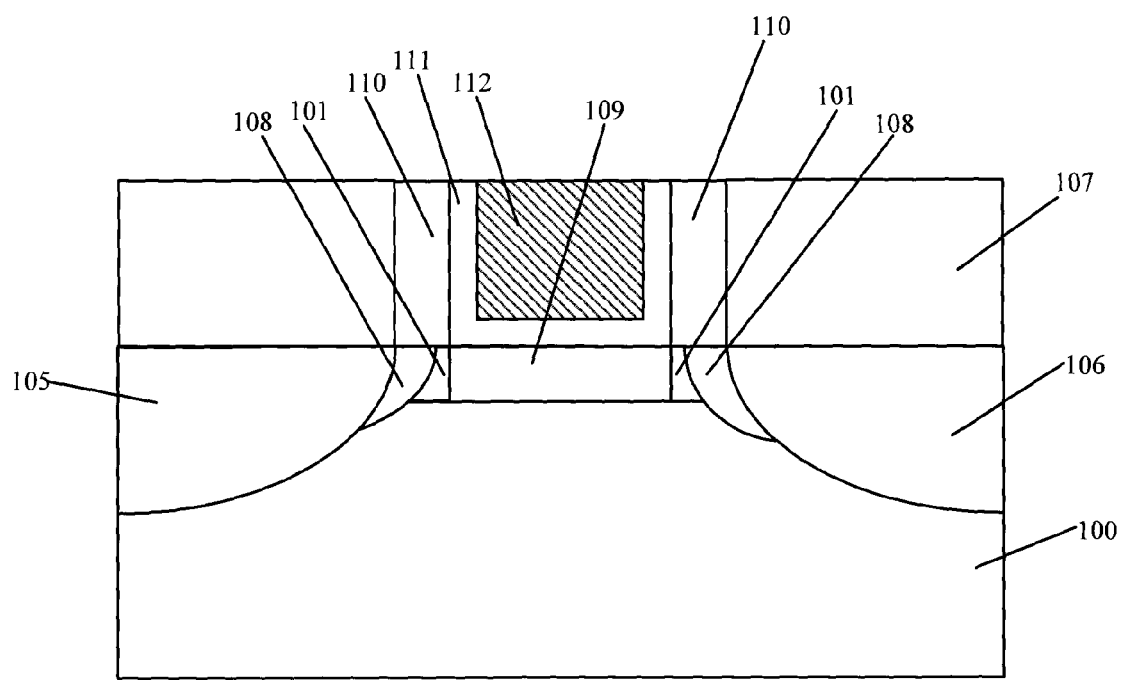
FIG. 11 is a cross-sectional view of structure of a transistor, illustrating a method for forming a transistor according to an embodiment of the present invention.

Referring to FIG. 11, metal gate spacers 110 are formed on sidewalls of the opening. The metal gate spacers 110 may have material selected from at least one of silicon oxide, silicon nitride, silicon carbon, silicon oxide nitride, and any combination thereof. The metal gate spacers 110 have thickness of no more than 20 nm for reducing area of the transistor. The metal gate spacers 110 replace the dummy gate spacers, and have locations corresponding to locations of the source region 105 and the drain region 106.

Subsequently, a high K dielectric layer 111 is formed on a bottom and sidewalls of the opening of the interlayer dielectric layer 107. The high K dielectric layer 111 may have material selected from at least one of hafnium oxide, silicon hafnium oxide, lanthanum oxide, zirconium oxide, silicon zirconium oxide, titanium oxide, tantalum oxide, titanium strontium barium oxide, titanium barium oxide, aluminium oxide and any combination thereof. The high K dielectric layer 111 covers the channel layer 109.

The high K dielectric layer 111 is formed on a bottom and sidewalls of the opening of the interlayer dielectric layer 107, and therefore reduces current leakage of the transistor.

Referring to FIG. 11, a metal gate 112 is formed in the opening. The metal gate 112 is substantially flush with the interlayer dielectric layer 107, the metal gate spacers 110 and the high K dielectric layer 111. The metal gate 112 and the high K dielectric layer 111 constitute a metal gate structure.

A transistor formed by the method above includes:

a substrate 100, a semiconductor layer 101 being formed on the substrate 100, and the semiconductor layer 101 and the substrate 100 having different crystal orientation;

an interlayer dielectric layer 107 formed on the semiconductor layer 101;

an opening defined in the interlayer dielectric layer 107, the semiconductor layer 101 being exposed at a bottom of the opening;

a metal gate structure formed in the opening, and including a high K dielectric layer 111 and a metal gate 112, the high K dielectric layer 111 being formed on a bottom and sidewalls of the opening;

metal gate spacers 110 formed on sidewalls of the opening, and between the metal gate structure and the interlayer dielectric layer 107, the metal gate spacers 110 having thickness of no more than 20 nm for preventing from excessively large area of the metal gate spacers 110 which may result in excessively large area of the transistor;

a source region 105 formed in the semiconductor layer 101 and the substrate 100, a location of the source region 105 corresponding to a location of a metal gate spacer 110;

a drain region 106 formed in the semiconductor layer 101 and the substrate 100, the source region 105 and the drain region 106 being respectively at opposite sides of the metal gate structure, a location of the drain region 106 corresponding to a location of the other metal gate spacer 110;

lightly doped regions 108 formed in the semiconductor layer 101 and the substrate 100 and at opposite sides of the metal gate structure; and a channel layer 109 located in the semiconductor layer 101 and between the source region 105 and the drain region 106, a location of the channel layer 109 corresponding to locations of the opening and the metal gate structure, the channel layer 109 being formed on the substrate 100 between the lightly doped regions 108, the channel layer 109 being substantially flush with the semiconductor layer 101, the channel layer 109 having the same crystal orientation as that of the substrate 100, the channel layer 109 acting as a channel region of the transistor, the channel layer 109 having doped ions, for example germanium ions or silicon ions.

The high K dielectric layer 111 may have material selected from at least one of hafnium oxide, silicon hafnium oxide, lanthanum oxide, zirconium oxide, silicon zirconium oxide, titanium oxide, tantalum oxide, titanium strontium barium oxide, titanium barium oxide, aluminium oxide and any combination thereof.

The high K dielectric layer 111 is formed on a bottom and sidewalls of the opening of the interlayer dielectric layer 107, and therefore reduces current leakage of the transistor.

It should be noted that, the crystal orientation of the substrate 100 and the crystal orientation of the semiconductor layer 101 may vary depending on types of the transistor. In one embodiment, the transistor is an NMOS transistor. The substrate 100 has crystal orientation (100), and the semiconductor layer 101 has crystal orientation (110). Tensile stress is produced between the substrate 100 and the semiconductor layer 101, and thus raises mobility of electrons, benefiting saturation current of the NMOS transistor. Alternatively, the substrate 100 has crystal orientation (110), and the semiconductor layer 101 has crystal orientation (100). Compressive stress is produced between the substrate 100 and the semiconductor layer 101, and thus raises mobility of holes, thereby promoting saturation current of PMOS transistor.

The semiconductor layer 101 needs a certain thickness, for example 3 nm, for providing sufficient stress. However, the thickness of the semiconductor layer 101 may not be too large for avoiding that the transistor does not meet requirements of the transistor. The semiconductor layer 101 has thickness in a range of less than 32 nm. Therefore, sufficient stress is produced for effectively raising mobility of carriers without impacting on performance of the transistor. In one embodiment, the semiconductor layer 101 has thickness in a range of 3 to 30 nm.

According to an embodiment of the invention, a semiconductor layer is formed on a substrate, and has the crystal orientation different from that of the substrate. A dummy gate is formed on the semiconductor layer. A source region and a drain region are formed in the substrate and the semiconductor layer, and are respectively located on opposite sides of the dummy gate. Then the dummy gate is removed for forming an opening. The semiconductor layer is exposed in the opening. The semiconductor layer in the opening is non-crystallized and annealed for forming a channel layer. The channel layer acts as a channel region between the source region and the drain region. The semiconductor layer and the substrate have different crystal orientation. Stress is produced between the substrate and the semiconductor layer, whereby carrier mobility, and thus saturation current of the transistor, is raised. The performance of a semiconductor device can be promoted. The crystal orientation of the channel layer is the same as the crystal orientation of the substrate. Therefore, carrier mobility of the channel region of the transistor will not descend.

The invention is disclosed, but not limited, by preferred embodiment as above. Based on the disclosure of the invention, those skilled in the art shall make any variation and modification without deviation from the scope of the invention. Therefore, any simple modification, variation and polishing based on the embodiments described herein belongs to the scope of the invention.

What is claimed is:

1. A method for forming a transistor, comprising:
providing a substrate, a semiconductor layer being formed on the substrate, the semiconductor layer and the substrate having a different crystal orientation;
forming a dummy gate structure on the semiconductor layer;
forming a source region and a drain region in the substrate and the semiconductor layer and at opposite sides of the dummy gate structure;
forming an interlayer dielectric layer on the semiconductor layer, the interlayer dielectric layer being substantially flush with the dummy gate structure;
removing the dummy gate structure to form an opening in the interlayer dielectric layer, the semiconductor layer being exposed at a bottom of the opening;
non-crystallizing a portion of the semiconductor layer exposed in the opening to form the portion of the semiconductor layer as a channel layer, wherein a remaining portion of the semiconductor layer exposed in the opening has the different crystal orientation than the underlying substrate to produce a stress there-between and to increase a carrier mobility in the channel layer;

annealing the channel layer so that the channel layer and the underlying substrate have a same crystal orientation to at least maintain the carrier mobility in the channel layer; and forming a metal gate structure in the opening, the metal gate being formed on the channel layer.

2. The method according to claim 1, wherein the transistor is an NMOS transistor, the substrate having crystal orientation (100), and the semiconductor layer having crystal orientation (110).

3. The method according to claim 1, wherein the transistor is a PMOS transistor, the substrate having crystal orientation (110), and the semiconductor layer having crystal orientation (100).

4. The method according to claim 1, wherein the semiconductor layer has thickness in a range of 3 to 30 nm.

5. The method according to claim 1, wherein the non-crystallization is performed by an ion implantation with doped ions comprising silicon ions, germanium ions or carbon ions.

6. The method according to claim 5, wherein the ion implantation of the silicon ions uses energy ranged of 2 to 30 KeV, a tilted angle of 0 to 15 degree, and a dose of 9E14 to 3E15 cm$^{-2}$, the ion implantation of the germanium ions uses energy ranged of 5 to 40 KeV, a tilted angle of 0 to 20 degree, and a dose of 1E15 to 4E15 cm$^{-2}$, and the ion implantation of the carbon ions uses energy ranged of 1 to 10 KeV, a tilted angle of 0 to 15 degree, and a dose of 1 E12 to 5E12 cm$^{-2}$.

7. The method according to claim 1, wherein an annealing temperature is ranged from 550 to 750 degree Celsius, and wherein gases for annealing are inertial gas, nitrogen gas, or combination of inert gas and nitrogen gas.

8. The method according to claim 1, further comprising a lightly doped ion implantation for forming lightly doped regions in the substrate and the semiconductor layer, and at opposite sides of the dummy gate structure or the metal gate structure.

9. The method according to claim 8, wherein a tilted angle of the lightly doped ion implantation is ranged from 15 to 40 degrees.

10. The method according to claim 1, wherein forming a metal gate structure on the semiconductor layer comprises: forming a high K dielectric layer on a bottom and sidewalls of the opening, and forming a metal gate on the high K dielectric layer, the metal gate and the high K dielectric layer constituting a metal gate structure.

11. The method according to claim 10, wherein the high K dielectric layer has material selected from at least one of hafnium oxide, silicon hafnium oxide, lanthanum oxide, zirconium oxide, silicon zirconium oxide, titanium oxide, tantalum oxide, titanium strontium barium oxide, titanium barium oxide, aluminium oxide and any combination thereof.

12. The method according to claim 1, wherein metal gate spacers are formed on sidewalls of the opening, locations of the metal gate spacers corresponding to locations of the source region and the drain region.

13. The method according to claim 12, wherein the metal gate spacers have material selected from at least one of silicon oxide, silicon nitride, silicon carbon, silicon oxide nitride, and any combination thereof, and wherein the metal gate spacers have thickness of no more than 20 nm.

14. A transistor comprising:
a substrate, a semiconductor layer being formed on the substrate, the semiconductor layer and the substrate having a different crystal orientation;
an interlayer dielectric layer formed on the semiconductor layer;
an opening defined in the interlayer dielectric layer, the semiconductor layer being exposed at a bottom of the opening;
a metal gate structure formed in the opening, and including a high K dielectric layer and a metal gate, the high K dielectric layer being forged on a bottom and sidewalls of the opening;
a source region formed in the semiconductor layer and the substrate;
a drain region formed in the semiconductor layer and the substrate, the source region and the drain region being respectively at opposite sides of the metal gate structure; and
a channel layer located in a first portion of the semiconductor layer through an entire thickness of the first portion of the semiconductor layer between the source region and the drain region, a crystal orientation of the channel layer being same as a crystal orientation of the underlying substrate to at least maintain a carrier mobility in the channel layer, wherein a second portion of the semiconductor layer has the different crystal orientation than the underlying substrate to produce a stress there-between and to increase the carrier mobility in the channel layer and a location of the first portion and the second portion of the semiconductor layer corresponds to a location of the opening between the source region and the drain region.

15. The transistor according to claim 14, wherein the transistor is an NMOS transistor, the substrate having crystal orientation (100), and the semiconductor layer having crystal orientation (110).

16. The transistor according to claim 14, wherein the transistor is a PMOS transistor, the substrate having crystal orientation (110), and the semiconductor layer having crystal orientation (100).

17. The transistor according to claim 14, wherein the semiconductor layer has thickness in a range of 3 to 30 nm.

18. The transistor according to claim 14, wherein lightly doped regions are formed in the substrate and the semiconductor layer, and at opposite sides of the metal gate structure and the channel layer.

19. The transistor according to claim 14, wherein the channel layer has doped ions which comprise silicon ions, germanium ions or carbon ions.

20. The transistor according to claim 14, wherein a metal gate structure on the semiconductor layer comprises a high K dielectric layer on a bottom and sidewalls of the opening, and a metal gate on the high K dielectric layer, the metal gate and the high K dielectric layer constituting a metal gate structure.

* * * * *